United States Patent [19]
Brooks et al.

[11] Patent Number: 5,824,569
[45] Date of Patent: Oct. 20, 1998

[54] SEMICONDUCTOR DEVICE HAVING BALL-BONDED PADS

[75] Inventors: J. Mike Brooks, Caldwell; Alan G. Wood; Kevin G. Duesman, both of Boise, all of Id.

[73] Assignee: Micron Technology, Inc., Boise, Id.

[21] Appl. No.: 611,314

[22] Filed: Mar. 5, 1996

Related U.S. Application Data

[63] Continuation-in-part of Ser. No. 225,196, Apr. 8, 1994, Pat. No. 5,496,775, which is a continuation of Ser. No. 914,275, Jul. 15, 1992, abandoned.

[51] Int. Cl.⁶ .................................................. H01L 21/44
[52] U.S. Cl. .......................................... 438/127; 438/118
[58] Field of Search .................................... 438/112, 124, 438/125, 126, 727, 118

[56] References Cited

U.S. PATENT DOCUMENTS

| | | | |
|---|---|---|---|
| 3,212,160 | 10/1965 | Dale et al. ................................ | 257/738 |
| 4,600,600 | 7/1986 | Pammer et al. ......................... | 437/183 |
| 4,899,107 | 2/1990 | Corbett et al. .......................... | 324/158 |
| 5,019,535 | 5/1991 | Wojnarowski et al. ................. | 438/118 |
| 5,071,787 | 12/1991 | Mori et al. ............................... | 437/183 |
| 5,143,865 | 9/1992 | Hideshima et al. .................... | 437/183 |
| 5,207,585 | 5/1993 | Byrnes et al. ............................ | 439/66 |
| 5,225,023 | 7/1993 | Wojnarowski et al. ................. | 438/118 |
| 5,289,346 | 2/1994 | Carey et al. ............................. | 437/209 |
| 5,341,564 | 8/1994 | Akhauain et al. ....................... | 437/183 |
| 5,348,607 | 9/1994 | Wojnarowski .......................... | 437/209 |
| 5,496,775 | 3/1996 | Brooks .................................... | 438/127 |
| 5,567,656 | 10/1996 | Chun ...................................... | 438/127 |
| 5,663,106 | 9/1997 | Karauakis et al. ...................... | 438/127 |

OTHER PUBLICATIONS

Tape Automated bonding Standardization and Implementation Requirements (Proposal), Jul. 1983, Solid State Products Engineering Council, 2001 Eye St., NW, Washington D.C.

"Shindo TAB", a sales brochure for TAB tape, Toray Marketing & Sales (America), INC, 1875 S. Grant St., Ste. 720, San Mateo, CA.

*Primary Examiner*—Kevin Picardat

[57] ABSTRACT

A method for forming a semiconductor device comprises the steps of providing a semiconductor die having a plurality of pads thereon with at least one bond wire electrically coupled with one of the pads and providing a holder having a cavity therein. The die is placed in the cavity, then a layer of encapsulation is formed within the cavity to cover the die. Subsequently, the encapsulated die is removed from the cavity.

20 Claims, 6 Drawing Sheets

SEMICONDUCTOR DEVICE HAVING BALL-BONDED PADS

PRIORITY INFORMATION

This is a continuation-in-part of application Ser. No. 08/225,196, filed Apr. 8, 1994, now U.S. Pat. No. 5,496,775, which was a continuation of application Ser. No. 07/914,275, filed Jul. 15, 1992, now abandoned.

FIELD OF THE INVENTION

This invention relates to the field of integrated circuits and more particularly to a method for fabricating and packaging an integrated circuit device.

BACKGROUND OF THE INVENTION

Historically, integrated circuits (ICs) have comprised a semiconductor die supported by a conductive lead frame. As illustrated in FIG. 1, the typical IC 10 has lead frame leads 12, a die paddle 14, a semiconductor die 16 having a front side with circuitry and a back side, bond wires 18, and encapsulation material or other packaging layer 20. Bond wires 18 attach to bond pads (not shown) on the front of the die 16. Bond wires provide the connection between the die and the lead frame leads. The leads are attached to printed circuit boards (PCBs) or other devices (not shown).

The semiconductor industry pursues cost effective and reliable methods to decrease the size of semiconductor packages. The development of the dual in-line package (DIP) has been instrumental in the development of thin small outline packages (TSOPs), tape automated bonding (TAB), and chip-on-board (COB) technologies.

COB assembly processes typically include the steps of bonding a die to a substrate and interconnecting the die to the substrate, using either conventional wire bond or TAB methods.

In reference to FIG. 1, TAB technology has eliminated the lead frame leads 12 and paddle 14, and instead uses TAB tape. TAB tapes comprise a predesigned network of electrical lines and buses which are attached to an IC die. The use of TAB tape and the elimination of lead frames save on fabrication steps and costs. Typically, the die is connected to the TAB tape by a thermocompression or thermosonic bonder.

The prior processes have various disadvantages. Specifically, the testing of IC chips occurs after the TAB tape is attached to a number of die and to the substrate. Thus, when reliability testing takes place, any defective die requires replacement which increases costs. Additionally, by using these processes, several steps occur while the die is unprotected or not encapsulated which can result in additional die defects from increased exposure to the environment.

A semiconductor device and method for forming the device which reduces the problems described above would be desirable.

SUMMARY OF THE INVENTION

One skilled in the art will appreciate the advantage of the subject IC and fabrication method for attaching an encapsulated and tested IC die to a PC board. Specifically, a semiconductor packaging technique is disclosed which is cost effective, reliable, and allows for testing of an IC die before it is mounted to TAB tape or soldered to a PC board. Uniquely, several layers of bonded beads are formed and stacked higher than a total IC covering.

Features of the present invention will become apparent from the following detailed description of the illustrated embodiments taken in conjunction with the accompanying drawings.

It is noted that the illustrated embodiments are not drawn to scale, and they are only generally representative of the features of the invention.

DETAILED DESCRIPTION OF THE PREFERRED EMBODIMENTS

The following U.S. patent is herein incorporated by reference: U.S. Pat. No. 4,899,107 is a discrete die burn-in for unpackaged die having same assignee as the present invention.

The following materials are incorporated by reference herein: Tape Automated Bonding Standardization and Implementation Requirements (Proposal), July, 1983, from the Solid State Products Engineering Council, 2001 Eye Street, NW, Washington D.C. 20006. Shindo TAB, a sales brochure for TAB tape, Toray Marketing & Sales (America), Inc., 1875 South Grant St., Suite 720, San Mateo, Calif. 94402.

Figure 1:
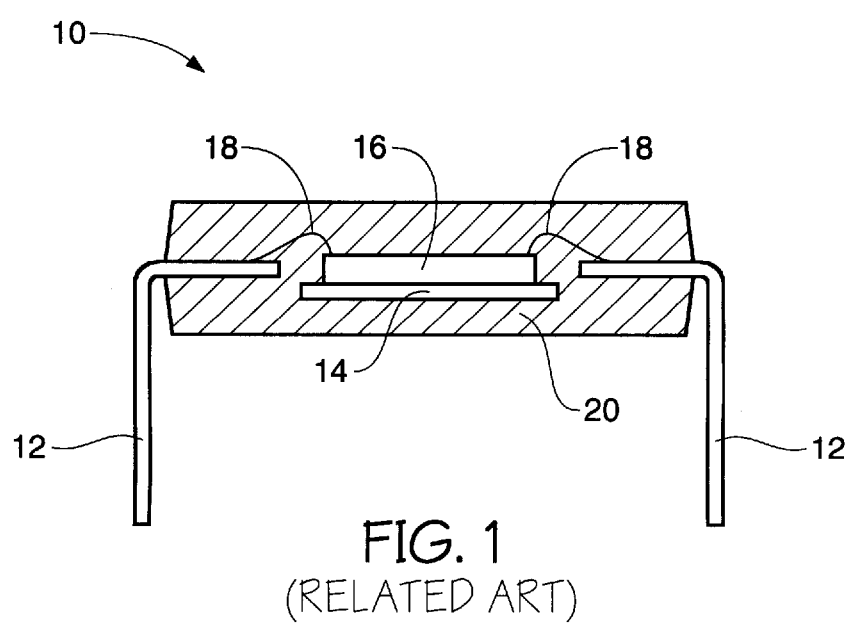
FIG. 1 is a cross section depicting a dual in-line package (DIP) semiconductor device.
Figure 2:
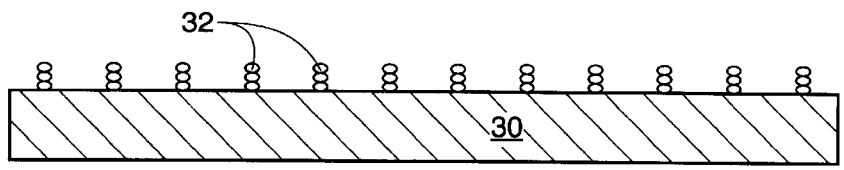
FIGS. 2 through 5 are cross sections illustrating process steps used with the inventive process.

FIG. 2 is a detailed illustration of a first fabrication process of the invention, and includes the following elements: IC die 30, and gold ball towers 32. Discrete conductive elements other than the conductive balls shown are possible, such as conductive blocks or the wires as later described.

In this first process there are two steps. First, a completed IC die is manufactured and second, gold balls are welded in a tower fashion onto each bond pad of the die. The balls may be formed by other means from other materials such as solder wire or other conductive materials.

One skilled in the art will recognize that there are many methods of creating a tower of gold material welding beads or balls. Moreover, 5 mil (1 mil=0.001 inches) wire is widely available which, after welding, will result in a ball having a diameter of about 15 mil. During the welding process the ball will decrease in height to about ½ to ⅔ of the diameter. It is noted that any size of gold bond wire may be used to comply with design constraints, and thus other sized balls may be similarly manufactured. Towers may be placed on any side of the die or on several sides of the die. Additionally, the gold material suggested may vary to other applicable materials or percentage of materials known for IC welding purposes. Finally, the height of the tower will vary depending upon the size of each ball and the number of balls used in the tower, for example up to 20 mils or higher. In this embodiment, it is desirable that the tower be higher than the encapsulating material.

Figure 3:
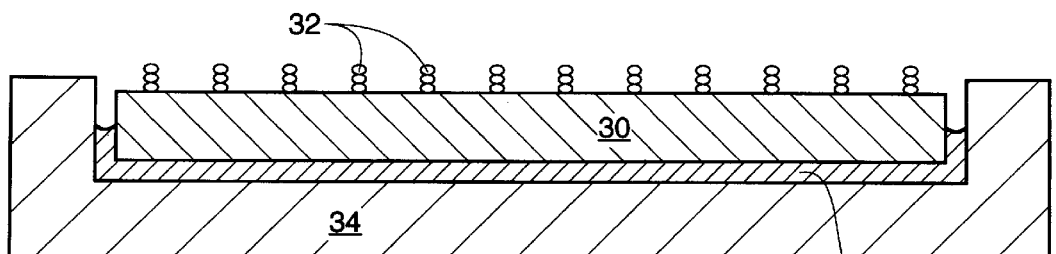

The second main fabrication process is illustrated in FIG. 3. As shown in FIG. 3, the gold ball tower bonded die is placed into a cavity of a cavity bar holder or other holder 34 and onto a first layer of encapsulation material 36A.

One skilled in the art will recognize that the gold towers are exposed and facing upwards. Moreover, the encapsulating material functions as a cushion between the die and holder 34, thus reducing damage. The encapsulating material may have any desired thickness on the faces of the die except, in this embodiment, for the side having the towers. The thickness of the encapsulating material on the tower side of the die is less than the height of the towers and allows for subsequent welding steps. Additionally, most any commonly known encapsulant material will suffice, such as siloxane polyimide etc.

Figure 4:
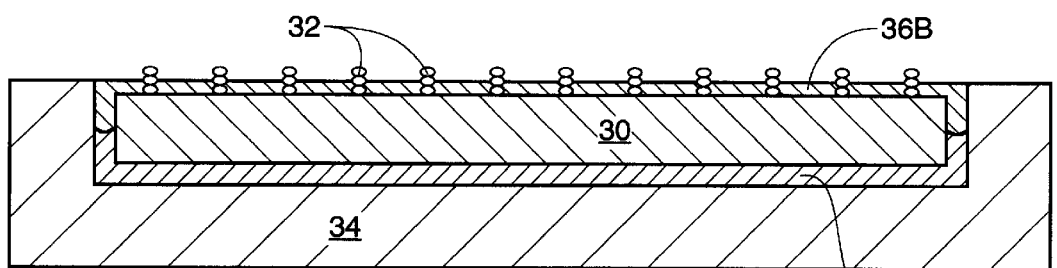
Figure 5:
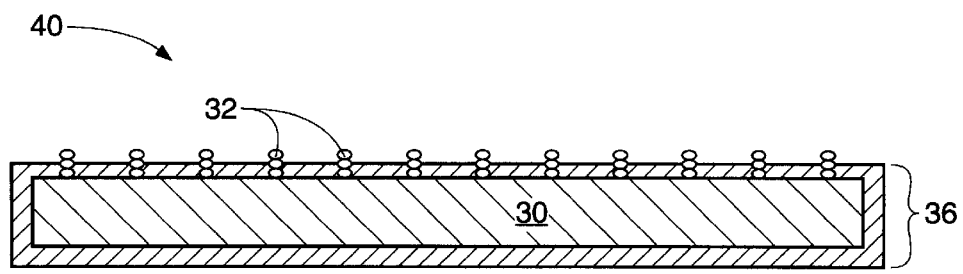

A third main fabrication process is illustrated in FIG. 4. In this step a second layer of encapsulation material 36B is applied over the tower side of the die. Thereby, the die surface is covered while the towers are partially submerged in the material. However, it is noted that a portion of the towers are not submerged in the material. The encapsulant fills a volume not occupied by encapsulation material 36A resulting in an encapsulated IC die as illustrated in FIG. 5 after the encapsulated device 40 is removed from the holder 34.

Figure 6:
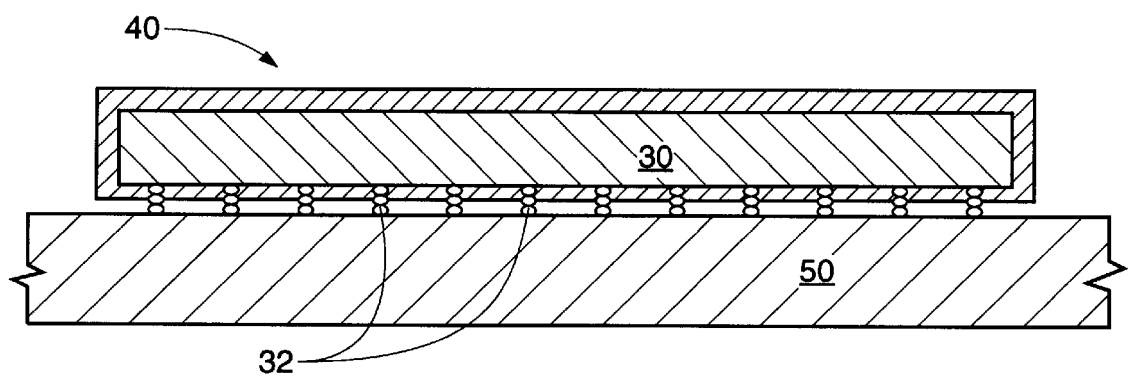
FIG. 6 illustrates the bonding of ball bonded IC die to an electrical substrate providing electrical connection to other devices.

One skilled in the IC fabrication art will recognize that towers 32 function as leads. Therefore, the IC 40 can be tested for reliability and other factors before being mounted to tab tape or a PC board 50 as illustrated in FIG. 6. Additionally, IC contamination at later steps is reduced since the encapsulating process is completed.

One skilled in the art will recognize that there are many variations to the illustrated embodiment. The ball bonded material may be any suitable welding material, such as compositions comprising aluminum, palladium, or other suitable materials.

The encapsulation can comprise many types of known materials suitable for that purpose, such as siloxane polyimide and epoxy novolac based materials.

There are several methods of attaching the completed ball bonded die onto a substrate. It is possible to weld the ball tower to the substrate. The ball bonded die can also be clipped into a type of receptacle or socket, thus enabling easier removal for faster replacement of parts.

Figure 7:
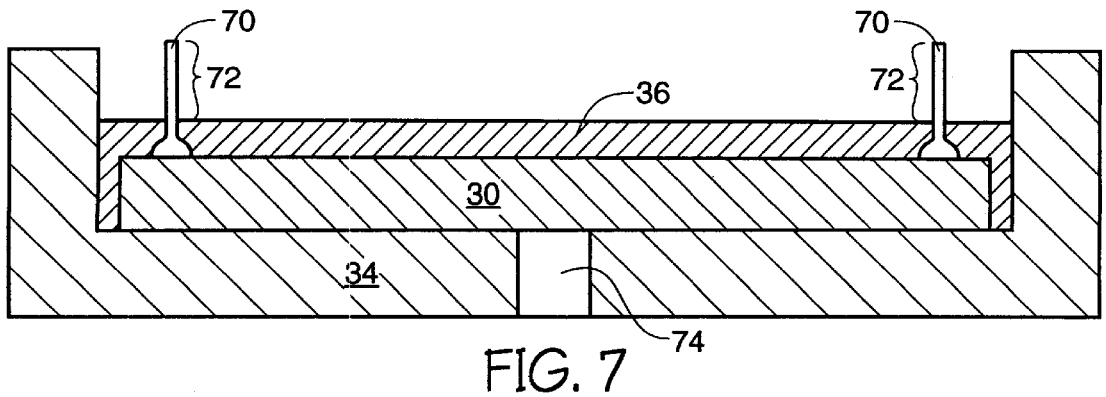
FIGS. 7–8 depict cross sections of an embodiment comprising wires for connection to bond pads.
Figure 8:
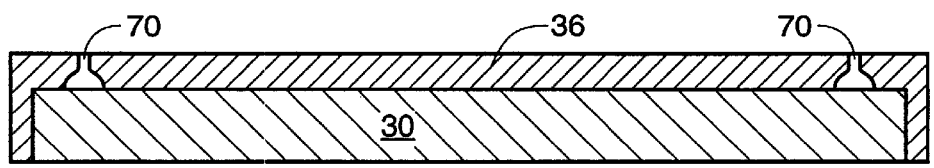

FIGS. 7 and 8 are cross sections showing another embodiment of the invention. In this inventive method for forming a semiconductor device, and the structure which results therefrom, a semiconductor die 30 is provided which has a plurality of bond pads (not shown) thereon with a wire 70 such as a ball bond formed from bond wire and electrically coupled with each pad. The die is placed in a cavity bar holder 34 or other holder. In this embodiment, no first layer of encapsulation is placed in the holder, although a first layer to cover the bottom of the holder can be formed as with previous embodiments to completely encapsulate the die 30. The wire comprises a protruding portion 72 which protrudes from the encapsulation material 36 as shown. In an alternate embodiment, a vacuum can be placed on a hole 74 through the holder 34 which secures the die to the holder. An embodiment using the vacuum hole may reduce movement of the die as the encapsulation is being formed in the cavity.

After the die is placed within the cavity of the holder, a layer of encapsulation 36 is formed within the cavity to cover the die 30 and a portion of the bond wire 70. Either before or after the die has been removed from the cavity, at least a portion, or preferably all of the protruding portion of each bond wire is removed such that the bond wire is exposed at the surface of the encapsulated device. Contact can then be made to some or all of the exposed portions of the bond wires.

Figure 9:
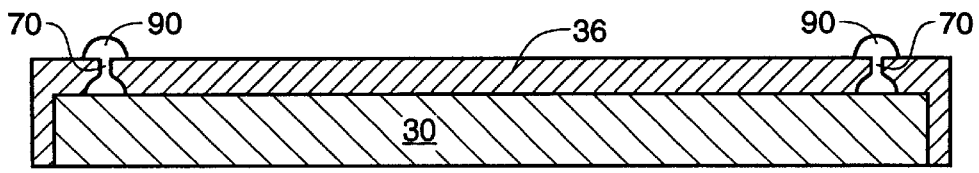
FIG. 9 is a cross section showing the wires of FIG. 7 which have been flamed back (heated) to form raised contacts.

FIG. 9 shows another embodiment of the invention. In this embodiment, the structure of FIG. 7 is formed as described above, and the protruding portions are trimmed (if necessary) and heated. The heat exposure melts at least a portion of the exposed protruding bond wire and results in a raised contact or bump 90 which forms proximate the layer of encapsulation as shown. Contact can then be made to some or all of the raised contacts.

In the embodiments of FIGS. 7–9 the back of the semiconductor die is exposed. Leaving the back of the die exposed may simplify the manufacturing process as forming two layers of encapsulation (one before placing the die in the cavity and one after) may be eliminated. Leaving the back of the die exposed would create no difficulties in many uses of the invention as the corner near the bond pads is covered by encapsulation. Also, a holder having sloped walls may aid in the removal of the encapsulated device. For example, a slope of about 10° or less would assist in the device removal while not excessively altering the outline of the package.

Figure 10:
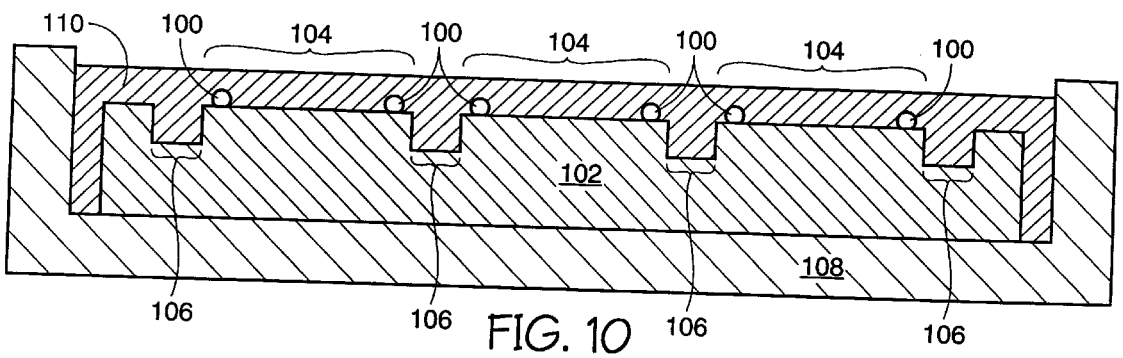
FIGS. 10–13 show embodiments having channels within a wafer section.
Figure 11:
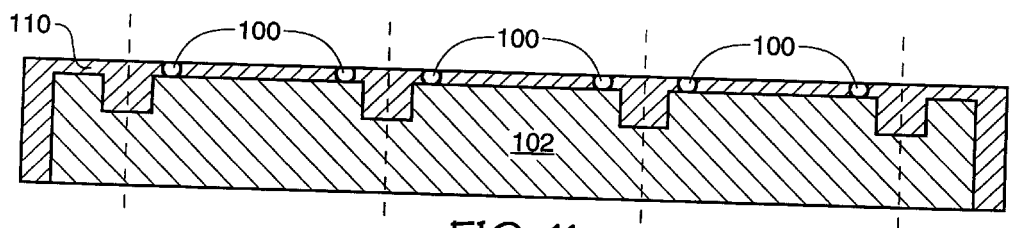
Figure 12:
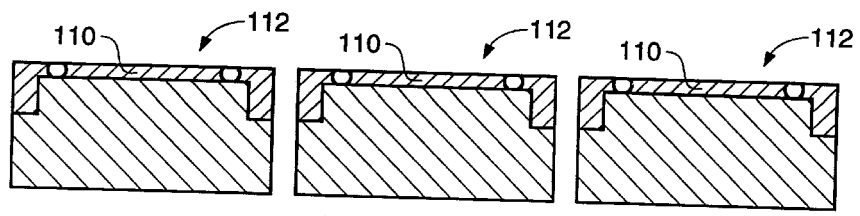

FIGS. 10–12 show another inventive embodiment of the invention. In this embodiment, conductive balls 100 such as those described in FIGS. 2–6 are shown with one or more ball on each bond pad, although an embodiment having the wires as described with FIGS. 7–9 would also be sufficient. In the embodiment of FIGS. 10–12 a wafer section 102 such as a part of a wafer or an entire wafer is provided which comprises a plurality of semiconductor die 104 with a channel 106 formed between the die 104. The channels can be formed chemically by etching the die, mechanically such as by abrasive dicing, or by any workable means. The wafer section is placed in the holder 108, then encapsulation 110 is formed within the cavity and over the wafer section and conductive balls. The conductive balls can be completely covered as shown, or the encapsulation can be formed to cover the wafer section and leave a portion of the conductive balls exposed. If the conductive balls are completely covered, they are exposed by removing a portion of the encapsulation such as shown in FIG. 11. The encapsulation can be removed by laser ablation, chemical or mechanical means, or by other workable means. The entire surface can be planarized or a local removal of the encapsulation proximate the bond pads is also possible. Embodiments are also feasible wherein the encapsulation is not removed and contact is made to the conductive balls by a conductive probe which pierces the encapsulation.

After forming the encapsulation within the cavity and the channels, the die are segmented at the channels to result in the individual die packages 112 as shown in FIG. 12. The die can be segmented at the channels by mechanically or chemically abrading the encapsulation which surrounds the die and the semiconductor material which forms the die. In one exemplary preferred embodiment, the die are segmented using a saw blade of thickness less than the channel widths so as to leave encapsulation material for protecting the upper peripheral edges of the die.

Figure 13:
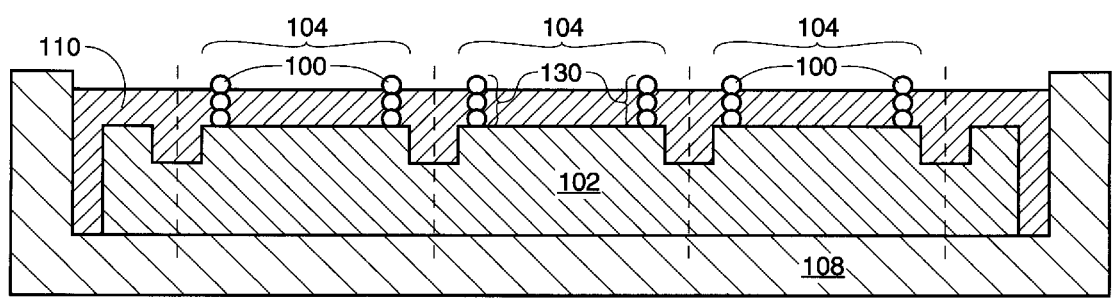

FIG. 13 shows an embodiment similar to the embodiment of FIGS. 10–12 wherein a plurality of conductive balls 130 are formed on each bond pad and the encapsulation leaves at least a portion of one ball exposed. Removal of encapsulation to expose the ball is not required with this embodiment.

A semiconductor device formed in accordance with the invention could conceivably be attached along with other devices to a printed circuit board, for example to a computer motherboard or as a part of a memory module used in a personal computer, a minicomputer, or a mainframe. An assembly similar to that described in U.S. Pat. No. 5,360,992 to Lowrey, et al. which is assigned to Micron Technology, Inc. and incorporated herein by reference, is also feasible with the inventive structure described herein. The inventive device is useful in electronic devices related to telecommunications, the automobile industry, semiconductor test and manufacturing equipment, consumer electronics, or virtually any piece of consumer or industrial electronic equipment.

While the invention has been taught with specific reference to one embodiment, one skilled in the art will recognize that changes can be made in form and detail without departing from the spirit and the scope of the invention. For example, instead of gravity leveling the encapsulation it may be possible to spin coat the die (or wafer or wafer section) with encapsulation to optimize the thickness of the encapsulation.

What is claimed is:

1. A method for forming a semiconductor device comprising the following steps:
   providing a semiconductor die having a plurality of pads thereon with at least one discrete conductive element on at least one of said pads;
   providing a holder having a cavity therein;
   placing said semiconductor die in said cavity;
   subsequent to placing said die within said cavity, forming a layer of encapsulation material within said cavity thereby covering said die with said encapsulation material; and
   subsequent to forming said layer of encapsulation, removing said encapsulated die from said cavity.

2. The method of claim 1, wherein a plurality of discrete conductive elements are formed over at least one of said pads.

3. The method of claim 1 further comprising the steps of:
   completely covering said discrete conductive element with said encapsulation;
   removing a portion of said encapsulation to expose at least a portion of said discrete conductive element.

4. The method of claim 1 further comprising the step of placing said die on said holder during said step of placing said semiconductor die in said cavity.

5. The method of claim 4 wherein a portion of said die remains exposed after said step of removing said encapsulated die from said cavity.

6. The method of claim 1 wherein said layer of encapsulation is a second layer of encapsulation, further comprising the steps of:
   forming a first layer of encapsulation within said cavity prior to said step of placing said die in said cavity;
   placing said die on said first layer of encapsulation during said step of placing said die in said cavity.

7. A method of forming a semiconductor device, comprising:
   providing a wafer section comprising a plurality of semiconductor die each having a plurality of pads thereon, with at least one conductive ball on at least one of said pads of each of said die;
   placing said wafer section in said cavity;
   subsequent to placing said wafer section within said cavity, forming a layer of encapsulation material within said cavity thereby covering said wafer section with said encapsulation material; and
   subsequent to forming said layer of encapsulation, removing said encapsulated wafer section from said cavity.

8. The method of claim 7 wherein said wafer section comprises a semiconductor wafer.

9. The method of claim 7 further comprising the steps of:
   completely covering said conductive balls with said encapsulation;
   removing a portion of said encapsulation to expose at least a portion of said conductive balls.

10. The method of claim 7 further comprising the step of placing said plurality of die on said holder during said step of placing said semiconductor die in said cavity.

11. The method of claim 10 wherein said plurality of die remain exposed after said step of removing said encapsulated die from said cavity.

12. The method of claim 7 wherein said layer of encapsulation is a second layer of encapsulation, further comprising the steps of:
   forming a first layer of encapsulation within said cavity prior to said step of placing said wafer section in said cavity;
   placing said wafer section on said first layer of encapsulation during said step of placing said wafer section in said cavity.

13. The method of claim 7 further comprising the following steps:
   forming a channel between said die;
   forming encapsulation material within said channel;
   subsequent to forming said encapsulation within said channel, segmenting said die at said channel.

14. A method for forming a semiconductor device comprising the following steps:
   providing a semiconductor die having a plurality of pads thereon with at least one bond wire electrically coupled with one of said pads;
   providing a holder having a cavity therein;
   placing said semiconductor die in said cavity;
   subsequent to placing said die within said cavity, forming a layer of encapsulation material within said cavity thereby covering said die with said encapsulation material; and
   subsequent to forming said layer of encapsulation, removing the encapsulated die from said cavity.

15. The method of claim 14 wherein said bond wire comprises a protruding portion which protrudes from said encapsulation material subsequent to said step of forming said layer of encapsulation material, further comprising the step of removing at least part of said protruding portion of said bond wire.

16. The method of claim 14 wherein said bond wire comprises a protruding portion which protrudes from said encapsulation material subsequent to said step of forming said layer of encapsulation material, further comprising the step of heating said protruding portion of said bond wire so as to form a raised contact proximate said layer of encapsulation.

17. The method of claim 14 wherein said die is one of a plurality of unsegmented semiconductor die each having a plurality of bond pads thereon, said plurality of die forming a wafer section, further comprising the following steps:
   providing at least one bond wire electrically coupled with one of said pads of each of said die;
   placing said wafer section in said cavity;

during said step of forming a layer of encapsulation material within said cavity, covering said wafer section with said encapsulation material.

18. The method of claim 17 further comprising the following steps:

forming a channel between said die;

forming encapsulation material within said channel;

subsequent to forming said encapsulation within said channel, segmenting said die at said channel.

19. The method of claim 18 wherein said each said bond wire comprises a protruding portion which protrudes from said encapsulation material subsequent to said step of forming said layer of encapsulation material, further comprising the step of removing at least part of said protruding portion of each said bond wire.

20. The method of claim 18 wherein each said bond wire comprises a protruding portion which protrudes from said encapsulation material subsequent to said step of forming said layer of encapsulation material, further comprising the step of heating each said protruding portion of each said bond wire such that said each protruding portion forms a raised contact proximate said layer of encapsulation.

* * * * *